(12) United States Patent
Feenan

(10) Patent No.: US 7,024,106 B1
(45) Date of Patent: Apr. 4, 2006

(54) SYSTEM AND METHOD FOR MELTING ICE IN AN EXHAUST TUBE OF A CONTAINER HOLDING HELIUM

(75) Inventor: Peter John Feenan, Freeland (GB)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/905,943

(22) Filed: Jan. 27, 2005

(51) Int. Cl.
*F24H 1/10* (2006.01)
(52) U.S. Cl. .................................... 392/480; 392/479
(58) Field of Classification Search ................ 392/480
See application file for complete search history.

(56) References Cited

U.S. PATENT DOCUMENTS

| | | | |
|---|---|---|---|
| 4,543,794 A * | 10/1985 | Matsutani et al. ........... 62/47.1 |
| 4,796,433 A * | 1/1989 | Bartlett ........................ 62/47.1 |
| 4,824,454 A | 4/1989 | Kondo et al. .................... 62/37 |
| 5,936,499 A * | 8/1999 | Eckels ........................ 335/216 |
| 2004/0168451 A1 | 9/2004 | Bagley ...................... 62/196.4 |

* cited by examiner

*Primary Examiner*—Thor S. Campbell
(74) *Attorney, Agent, or Firm*—Cantor Colburn LLP

(57) ABSTRACT

A system and a method for melting ice that has formed in an exhaust tube operably coupled to a container holding helium are provided. The exhaust tube is configured to exhaust pressurized helium from the container. The method includes determining when a pressure level in the container is greater than a threshold pressure level. The method further includes applying heat energy to the exhaust tube to melt ice in the exhaust tube to thereby allow pressurized helium to exit the container through the exhaust tube.

20 Claims, 3 Drawing Sheets

SYSTEM AND METHOD FOR MELTING ICE IN AN EXHAUST TUBE OF A CONTAINER HOLDING HELIUM

CROSS REFERENCE TO RELATED APPLICATIONS

This application claims the benefit of a priority under 35 U.S.C. 119 to United Kingdom Patent Application No. 0427571.5 filed Dec. 16, 2004, the entire contents of which are hereby incorporated by reference.

DESCRIPTION

BACKGROUND OF THE INVENTION

A magnetic resonance imaging (MRI) device has a container holding helium therein for cooling magnetic coils utilized in the device. An interior of the container is often maintained at a pressure level below an atmospheric pressure level. The container further includes an exhaust tube for exhausting helium from the container when a pressure level in the interior of the container is greater than a predetermined pressure. If a leak occurs in the container, air can be sucked from ambient atmosphere into the interior of the container. Further, the air can freeze in the exhaust tube to form an ice blockage therein. When a helium boil-off condition occurs in the container, the ice blockage in the exhaust tube can result in relatively high pressure levels within the container.

Accordingly, there is a need for a system and a method for melting ice in an exhaust tube of a container holding helium.

BRIEF DESCRIPTION OF THE INVENTION

An embodiment of the invention is directed to a method for melting ice that has formed in an exhaust tube operably coupled to a container holding helium. The exhaust tube is configured to exhaust pressurized helium from the container. The method includes determining when a pressure level in the container is greater than a threshold pressure level. The method further includes applying heat energy to the exhaust tube to melt ice in the exhaust tube to thereby allow pressurized helium to exit the container through the exhaust tube.

Another embodiment of the invention is directed to a system for melting ice that has formed in an exhaust tube operably coupled to a container holding helium. The exhaust tube is configured to exhaust pressurized helium from the container. The system includes a conduit having first, second, third, and fourth portions. The system further includes a valve operatively coupled to the fourth portion of the conduit. The first portion is disposed in the container and communicates the pressurized helium from the container to the second portion. The second portion is disposed external of the container and transfers heat energy to the helium and communicates the helium to the third portion. The third portion is disposed in the container proximate the exhaust tube and transfers heat energy from the helium to the exhaust tube to melt the ice in the exhaust tube. The third portion communicates the helium to the fourth portion. The valve exhausts the helium from the fourth portion when the pressure level of the helium is greater than a threshold pressure level.

Another embodiment of the invention is directed to a system for melting ice that has formed in an exhaust tube operably coupled to a container holding helium. The exhaust tube is configured to exhaust pressurized helium from the container. The system includes a conduit extending through a wall of the container. The conduit has a first end communicating with an interior of the container and a second end disposed outside of the container. The system further includes a valve operatively coupled to the second end of the conduit. The valve is configured to open when a pressure level within the container is greater than a threshold pressure level. The system further includes an electrical switch operably coupled to the valve. The electrical switch is activated when the valve opens to transfer a signal to a controller. The controller is configured to energize a heating coil disposed proximate the exhaust tube in response to receiving the signal to melt the ice in the exhaust tube.

DETAILED DESCRIPTION OF THE INVENTION

Figure 1:
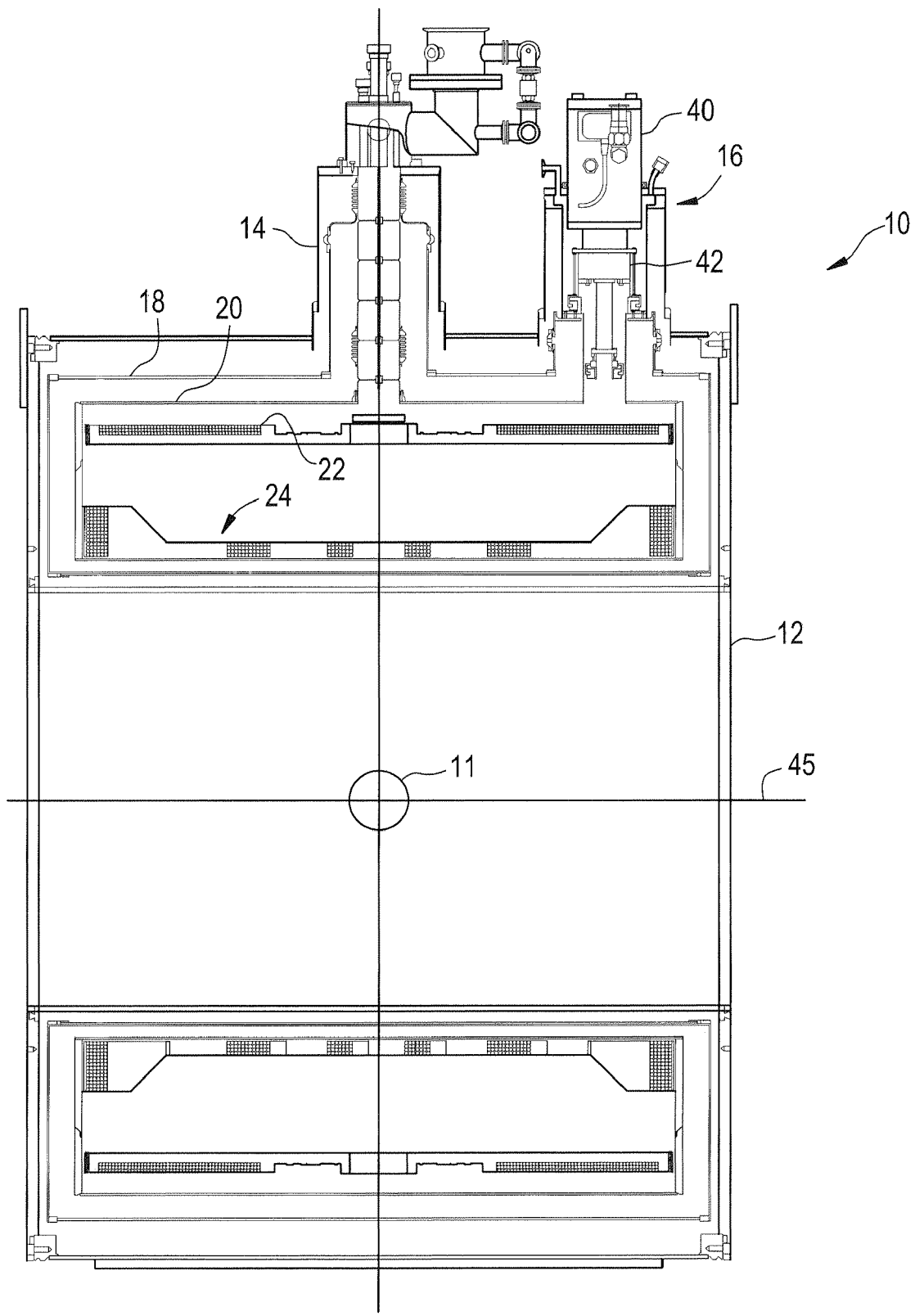
FIG. 1 is a schematic of an MRI device.
Figure 2:
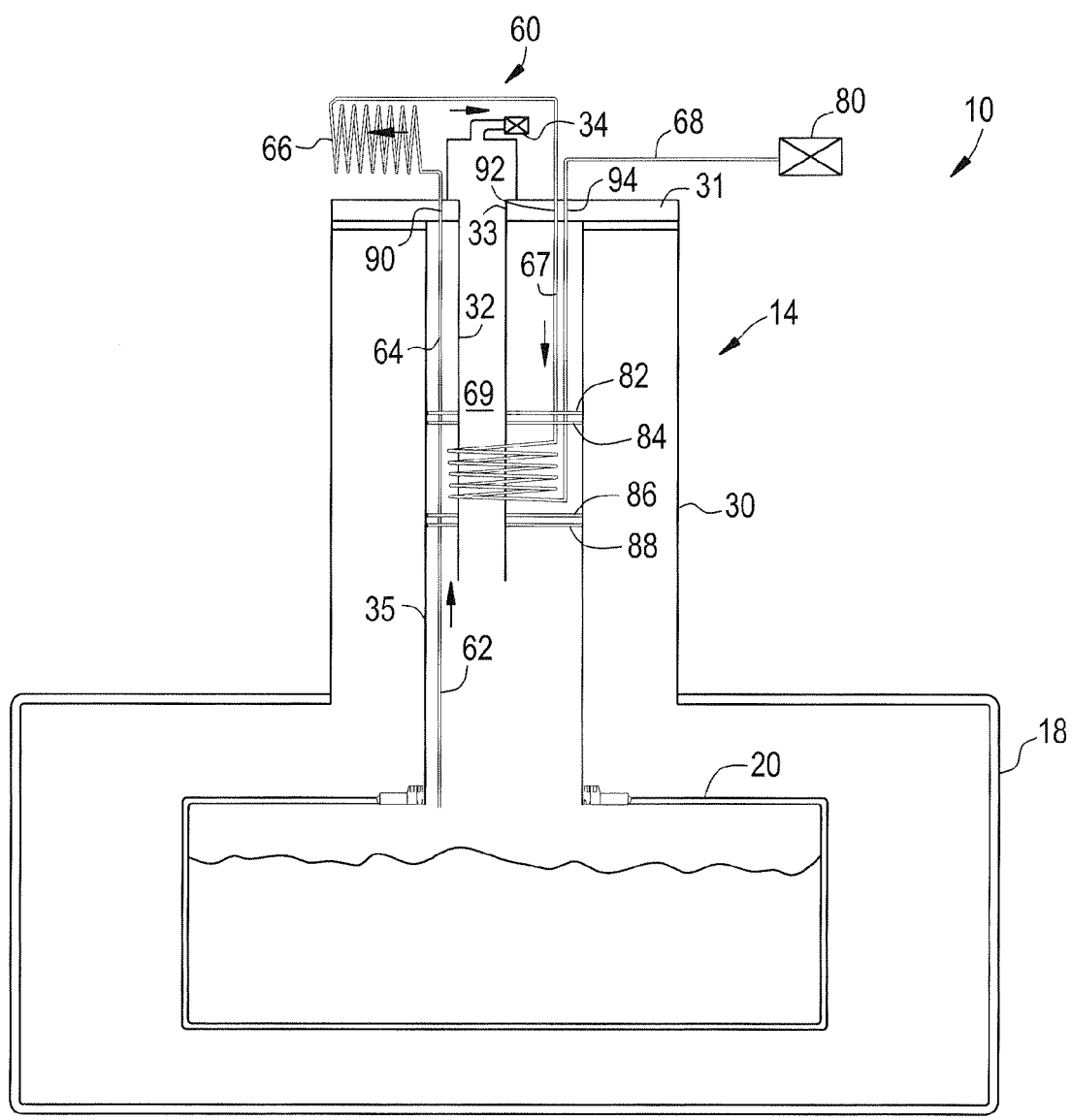
FIG. 2 is a schematic of a system for melting ice that has formed in an exhaust tube operably coupled to a container holding helium that is utilized in the MRI device of FIG. 1 in accordance with an exemplary embodiment.

Referring to FIGS. 1 and 2, an MRI device 10 for generating digital images of an object 11 is illustrated. The MRI device 10 includes a housing 12, a neck assembly 14, a cooling assembly 16, a container 18, a container 20, a screening magnetic coil assembly 22, and a main magnetic coil assembly 24.

The housing 12 is provided to hold the container 18, the container 20, and the magnetic coil assemblies 20, 24 therein. The housing 12 is constructed from stainless steel and is an airtight housing. In an alternate embodiment, the housing 12 can be constructed from other materials such as aluminum or titanium, for example.

Referring to FIG. 2, the neck assembly 14 is provided to vent pressurized helium from the container 20 when a pressure level of the helium is greater than a threshold pressure. The neck assembly 14 includes an outer tube 30 coupled to the housing 12, an inner tube 35, a top plate 31, an exhaust tube 32, and a check-valve 34. The outer tube 30, inner tube 35 are constructed from stainless steel. The top plate 31 is configured to cover an opening of the outer tube 30 and is also constructed from stainless steel. In an alternate embodiment, the outer tube 30, the inner tube 35 and the top plate 31 can be constructed from materials other than stainless steel, such as aluminum or titanium, for example. The inner tube 35 extends from the top plate 31 and through an interior region defined by the outer tube 30. The exhaust tube 32 extends longitudinally through an interior of the inner tube 35 and is coupled at a first end to the plate 31 such that an aperture 33 extending through the plate 31 communicates with an interior region of the exhaust tube 32. A second end of the exhaust tube 32 communicates with an interior of the container 20 holding liquid helium therein. The check-valve 34 fluidly communicates with the aperture 33 and is configured to the vent pressurized helium from the container 20 to ambient atmosphere when a pressure level within the container 20 is greater than a threshold pressure level.

When an air leak undesirably occurs within the housing 12 or the neck assembly 14, moisture in the air can freeze within the assembly 14 and form ice within an interior region of the exhaust tube 32. Thereafter, when a helium boil-off condition occurs, pressurized helium within the container 20 may be undesirably prevented from exiting the exhaust tube 32 by ice formed within the exhaust tube 32. As will be described in greater detail below, a system 60 is utilized to melt ice that has formed within the exhaust tube 32 in accordance with an exemplary embodiment.

Referring to FIG. 1, the cooling assembly 16 is provided to maintain the liquid helium within the container 20 at a relatively low temperature. The cooling assembly 16 includes a cooling subassembly 40 and a cooling subassembly 42. The cooling subassembly 40 fluidly communicates with the container 18 to maintain a temperature level of the container 18 between 20–40° Kelvin. The container 18 is provided to shield the container 20 contained therein from receiving external heat energy. The cooling subassembly 42 is in fluid communication with an interior of the container 20 to maintain a temperature level of the liquid helium stored within the container 20 at 4.2° Kelvin or lower. Of course, the subassembly 42 could maintain the helium at a temperature level greater than 4.2° K.

The container 18 extends circumferentially around axis 45 and is constructed from aluminum. In an alternate embodiment, the container 18 can be constructed from materials other than aluminum, such as stainless steel or titanium, for example.

The container 20 extends circumferentially around the axis 45 and is constructed from stainless steel. In an alternate embodiment, the container 20 can be constructed from materials other than stainless steel, such as titanium, for example. The container 20 is provided to store liquid helium therein for cooling magnetic coil assemblies 22, 24.

The screening magnetic coil assembly 22 is disposed within the container 20 and is cooled by the liquid helium stored within the container 20. The assembly 22 comprises a plurality of magnetic coils to shield the main magnetic coil assembly 24 from magnetic fields external from the device 10.

The main magnetic coil assembly 24 is disposed within the container 20 and is cooled by the liquid helium stored within the container 20. The assembly 24 comprises a plurality of magnetic coils that generate magnetic fields for subassembly generating images of the object 11. The object 11 comprises a human being for example.

Referring to FIG. 2, the system 64 configured to melt ice formed within the exhaust tube 32 will now be described. The system 64 includes a conduit 62, a valve 80, and radiation baffles 82, 84, 86, 88.

The conduit 60 includes conduit portions 64, 66, 67, 68 and is constructed from stainless steel. In an alternate embodiment, the conduit 64 can be constructed from materials other than stainless steel, such as titanium, for example. The conduit portion 64 extends from an interior region of the container 20 and through the interior of the neck assembly 14 to an aperture 90 extending through the top plate 31. The conduit portion 62 communicates pressurized helium from the container 20 to the conduit portion 66 that is disposed outside of the device. The conduit portion 66 is bent into a plurality of loops for transferring heat energy from ambient atmosphere to the helium flowing through the conduit portion 66. The conduit portion 66 extends between the aperture 90 extending through the top plate 31 to the aperture 92 extending through the top plate 31. The conduit portion 66 communicates the helium to the conduit portion 67. The conduit portion 67 extends from the aperture 92 in the top plate 31 longitudinally through an interior of the neck assembly 14 to a position proximate a region 69 of the exhaust tube 32. The conduit portion 67 then extends circumferentially around the conduit member 32 and then extends upwardly through the interior of the neck assembly 14 to the aperture 94 extending through the top plate 31. The conduit portion 67 transmits heat energy from the helium disposed therein to the region 69 of the exhaust tube 32 to melt ice formed within the exhaust tube 32. The conduit portion 67 communicates the helium to the conduit portion 68 that extends from the aperture 94 of the top plate 31 to the check valve 80. The check valve 80 actuates from a closed operational position to an open operational position when a pressure level of the helium within the conduit portion 68 is greater than a threshold pressure level. When the check valve 80 opens, the pressurized helium within the container 20 flows through the conduit portions 64, 67, 68, 68 and through the check-valve 80 to ambient atmosphere.

The radiation baffles 82, 84 are provided to shield an interior region of the container 20 from the heat energy being received through the check valve 34 from ambient atmosphere. The radiation baffles 82, 84 are constructed from copper and are disposed around the exhaust tube 32 within the inner tube 35. Further, the radiation baffles 82, 84 are disposed above the region 69 of the exhaust tube 32.

The radiation baffles 86, 88 are provided to shield an interior region of the container 20 from the heat energy being emitted by the conduit portion 67. The radiation baffles 86, 88 constructed from copper and are disposed around the exhaust tube 32 within the inner tube 35. Further, the radiation baffles 86, 88 are disposed below region 69 of the exhaust tube 32.

Figure 3:
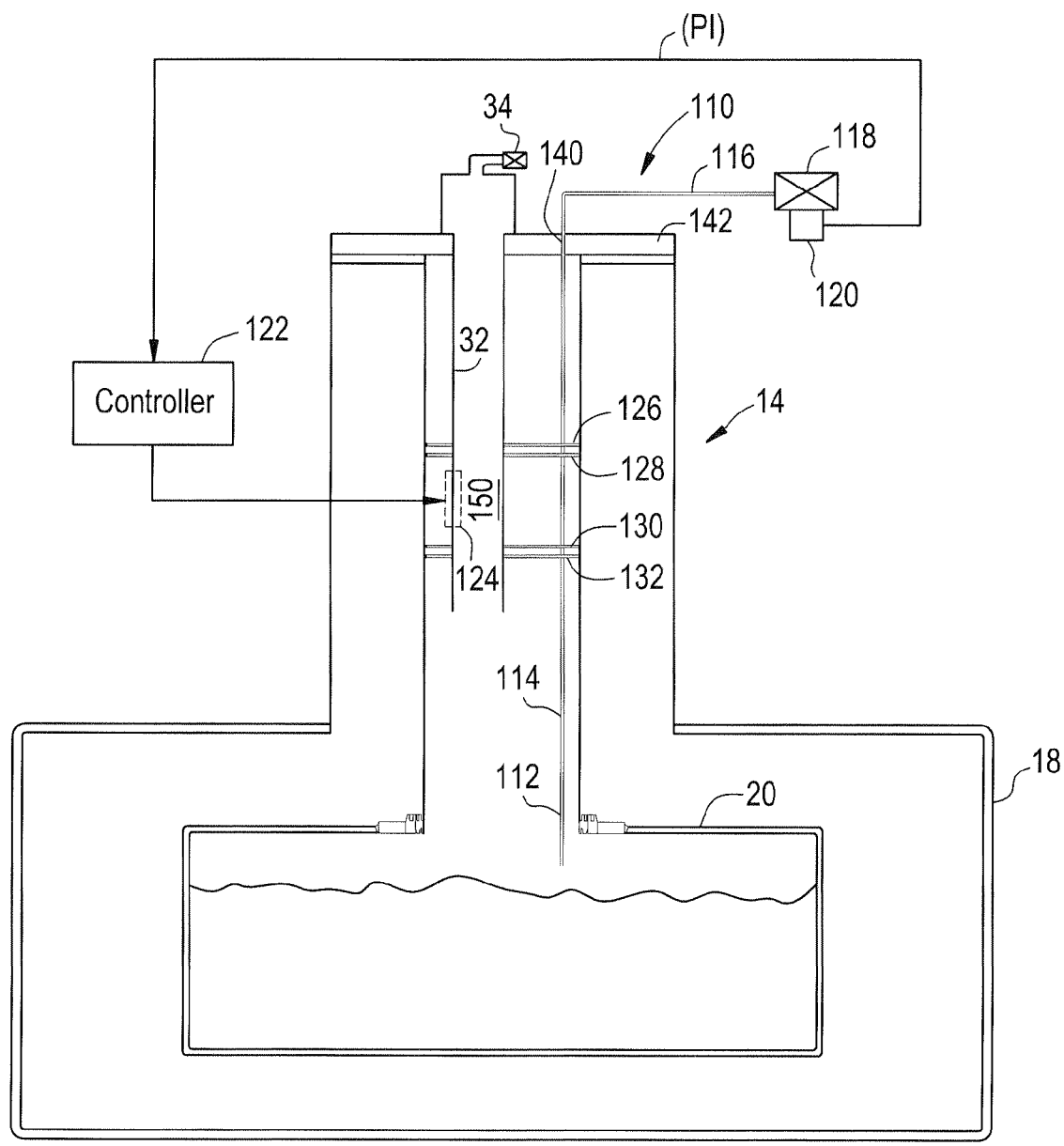
FIG. 3 is a schematic of a system for melting ice that has formed in an exhaust tube operably coupled to a container holding helium that is utilized in the MRI device of FIG. 1 in accordance with another exemplary embodiment.

Referring to FIG. 3, a system 110 for melting ice formed within the exhaust tube 32 will now be described. The system 110 can be utilized in the neck assembly 14 instead of the system 60 described above. The system 110 includes a conduit 112, a check-valve 118, an electronic switch 120, a controller 122, a heating coil 124, and the radiation baffles 126, 128, 130, 132.

The conduit 112 includes conduit portions 114, 116 and is constructed from stainless steel. In an alternate embodiment, the conduit 112 to be constructed from materials other than stainless steel such as titanium, for example. The conduit portion 114 extends from interior region of the container 20 and through the interior of the neck assembly 14 to an aperture 140 extending through a top plate 142. The conduit portion 114 communicates pressurized helium from the container 20 to the conduit portion 116 that is disposed outside of the device 10. The conduit portion 116 extends between the aperture 140 of the top plate 142 and the check valve 118. The pressurized helium within the conduit 116 communicates with the check-valve 118 and when the pressure level of the helium is greater then a threshold pressure level, indicating ice blockage within the exhaust tube 32, the check valve 118 actuates from a closed operational position to an open operational position to vent the helium to ambient atmosphere.

The electronic switch 120 is provided to generate a signal when the check valve 118 has an open operational position that results in pressurized helium being exhausted from the device 10. The electronic switch 120 is operably coupled to the check valve 118 and transmits a signal (P1) to a controller 122 when the valve 118 has open operational position.

The controller 122 is provided to receive the signal (P1) from the electronic switch 120 and to energize a heating coil 124 disposed proximate the exhaust tube 32 in response to the signal (P1). Thus, when an ice blockage within the exhaust tube 32 prevents pressurized helium from being exhausted from the container 20 to the check valve 34, a pressure level within the container 20 increases. When the pressure level within the container 20 is greater than a threshold pressure level, the helium within the conduit 112 induces the check-value 118 to move to an open operational position. In response, the switch 120 generate the signal (P1) that is received by the controller 122 which thereafter energizes the heating coil 120 to melt ice formed within the exhaust tube 32. When the ice blockage within the exhaust tube 32 is melted, pressurized helium flows through the exhaust tube 32 to the check-valve 34 that vents the helium to ambient atmosphere.

The radiation baffles 126, 128 are provided to shield an interior region of the container 20 from the heat energy being received through the check valve 34 from ambient atmosphere. The radiation baffles 126, 128 are constructed from copper and are disposed around the exhaust tube 32 within the inner tube 35. Further, the radiation baffles 126, 128 are disposed above the region 150 of the exhaust tube 32.

The radiation baffles 130, 132 are provided to shield an interior region of the container 20 from the heat energy being emitted by the heating coil 124. The radiation baffles 130, 132 are constructed from copper and are disposed around the exhaust tube 32 within the inner tube 35. Further, the radiation baffles 130, 132 are disposed below region 150 of the exhaust tube 32.

The system and the method for melting ice formed within an exhaust tube operably coupled to a container holding helium, provide a substantial advantage over other systems and methods. In particular, the system and the method provide a technical effect of detecting when an ice blockage has formed within the exhaust tube and thereafter supplying heat energy to the exhaust tube to melt the ice.

While embodiments of the invention are described with reference to the exemplary embodiments, it will be understood by those skilled in the art that various changes may be made and equivalence may be substituted for elements thereof without departing from the scope of the invention. In addition, many modifications may be made to the teachings of the invention to adapt to a particular situation without departing from the scope thereof. Therefore, it is intended that the invention not be limited to the embodiment disclosed for carrying out this invention, but that the invention includes all embodiments falling with the scope of the intended claims. Moreover, the use of the term's first, second, etc. does not denote any order of importance, but rather the term's first, second, etc. are used to distinguish one element from another. Furthermore, the use of the terms a, an, etc. do not denote a limitation of quantity, but rather denote the presence of at least one of the referenced items.

What is claimed is:

1. A method for melting ice that has formed in an exhaust tube operably coupled to a container holding helium, the exhaust tube configured to exhaust pressurized helium from the container to ambient atmosphere, comprising:
    determining when a pressure level in the container is greater than a threshold pressure level; and
    applying heat energy to the exhaust tube to melt ice in the exhaust tube to thereby allow pressurized helium to exit the container through the exhaust tube to ambient atmosphere.

2. The method of claim 1, wherein the step of determining when the pressure level in the container exceeds is greater than the threshold pressure level, comprises opening a check-valve when the pressure level in the container is greater than the threshold pressure level.

3. The method of claim 1, wherein the step of determining when the pressure in the container is greater than the threshold pressure level, comprises generating a signal when the pressure level in the container is greater than the threshold pressure level.

4. The method of claim 1, wherein the step of applying heat energy to the exhaust tube comprises energizing an electrical coil disposed proximate the exhaust tube to increase a temperature of the coil to melt the ice in the exhaust tube.

5. A system for melting ice that has formed in an exhaust tube operably coupled to a container holding helium, the exhaust tube configured to exhaust pressurized helium from the container, comprising:
    a conduit having first, second, third, and fourth portions; and
    a valve operatively coupled to the fourth portion of the conduit, the first portion being disposed in the container and communicating the pressurized helium from the container to the second portion, the second portion being disposed external of the container and transferring heat energy to the helium and communicating the helium to the third portion, the third portion being disposed in the container proximate the exhaust tube and transferring heat energy from the helium to the exhaust tube to melt the ice in the exhaust tube, the third portion communicating the helium to the fourth portion, the valve exhausting the helium from the fourth portion when the pressure level of the helium is greater than a threshold pressure level.

6. The system of claim 5, wherein the conduit is constructed from stainless steel.

7. The system of claim 5, wherein the valve comprises a check-valve configured to open when the pressure in the conduit is greater than the threshold pressure level.

8. The system of claim 5, wherein the second portion of the conduit is configured as a heat exchanger for transferring heat energy from ambient air to the helium inside of the second portion.

9. The system of claim 5, further comprising a radiation baffle disposed between the third portion of the conduit and liquid helium stored in the container to radiate heat energy away from the liquid helium.

10. The system of claim 5, further comprising a first magnetic coil disposed in the container configured to shield a portion of an interior of the container from magnetic fields generated external of the container.

11. The system of claim 10, further comprising a second magnetic coil disposed in the container configured to generate a magnetic field for obtaining MRI images of an object.

12. A system for melting ice that has formed in an exhaust tube operably coupled to a container holding helium, the exhaust tube configured to exhaust pressurized helium from the container, comprising:
    a conduit extending through a wall of the container, the conduit having a first end communicating with an interior of the container and a second end disposed outside of the container;
    a valve operatively coupled to the second end of the conduit, the valve being configured to open when a pressure level within the container is greater than a threshold pressure level;

an electrical switch operably coupled to the valve, the electrical switch being activated when the valve opens to transfer a signal to a controller; and the controller configured to energize a heating coil disposed proximate the exhaust tube in response to receiving the signal to melt the ice in the exhaust tube.

13. The system of claim 12, wherein the conduit is constructed from stainless steel.

14. The system of claim 12, wherein the valve comprises a check-valve configured to open when the pressure in the conduit is greater than the threshold pressure level.

15. The system of claim 12, further comprising a radiation baffle disposed between the heating coil and liquid helium stored in the container to radiate heat energy away from the liquid helium.

16. The system of claim 12, further comprising a first magnetic coil disposed in the container configured to shield a portion of an interior of the container from magnetic fields generated external of the container.

17. The system of claim 16, further comprising a second magnetic coil disposed in the container configured to generate a magnetic field for obtaining MRI images of an object.

18. A method for melting ice that has formed in an exhaust tube operably coupled to a container holding helium, the exhaust tube configured to exhaust pressurized helium from the container to ambient atmosphere, comprising:

determining when a pressure level in the container is greater than a threshold pressure level; and applying heat energy to the exhaust tube to melt ice in the exhaust tube to thereby allow pressurized helium to exit the container through the exhaust tube, wherein applying the heat energy comprises routing pressurized helium from the container through a conduit having first, second, third, and fourth portions, the first portion communicating the helium from the container to the second portion, the second portion being disposed external of the container and transferring heat energy to the helium and communicating the helium to the third portion, the third portion being disposed in the container proximate the exhaust tube and transferring heat energy from the helium to the exhaust tube to melt the ice in the exhaust tube, the third portion communicating the helium to the fourth portion communicating with ambient atmosphere.

19. The method of claim 18, wherein the step of determining when the pressure level in the container is greater than the threshold pressure level, comprises opening a check-valve when the pressure level in the container is greater than the threshold pressure level.

20. The method of claim 18, wherein the step of determining when the pressure in the container is greater than the threshold pressure level, comprises generating a signal when the pressure level in the container is greater than the threshold pressure level.

* * * * *

UNITED STATES PATENT AND TRADEMARK OFFICE
CERTIFICATE OF CORRECTION

| | | |
|---|---|---|
| PATENT NO. | : 7,024,106 B1 | Page 1 of 1 |
| APPLICATION NO. | : 10/905943 | |
| DATED | : April 4, 2006 | |
| INVENTOR(S) | : Peter John Feenan | |

It is certified that error appears in the above-identified patent and that said Letters Patent is hereby corrected as shown below:

Column 4,
Line 18, after "64," delete "67, 68" and insert therefor --66, 67--.
Line 54, after "greater", delete "then" and insert therefor --than--.

Column 5,
Line 9, after "120", delete "generate" and insert therefor --generates--.
Line 48, after "falling", delete "with" and insert therefor --within--.
Line 67, after "container", delete "exceeds".

Signed and Sealed this

Twenty-sixth Day of September, 2006

JON W. DUDAS
*Director of the United States Patent and Trademark Office*